US008492182B2

(12) United States Patent
Von Malm et al.

(10) Patent No.: US 8,492,182 B2
(45) Date of Patent: Jul. 23, 2013

(54) METHOD FOR THE PRODUCING OF A LIGHT-EMITTING SEMICONDUCTOR CHIP, METHOD FOR THE PRODUCTION OF A CONVERSION DIE AND LIGHT-EMITTING SEMICONDUCTOR CHIP

(75) Inventors: Norwin Von Malm, Nittendorf-Thumhausen (DE); Madis Raukas, Charlestown, MA (US); Darshan Kundaliya, Beverly, MA (US)

(73) Assignees: OSRAM Opto Semiconductors GmbH, Regensburg (DE); OSRAM SYLVANIA Inc., Danvers, MA (US)

( * ) Notice: Subject to any disclaimer, the term of this patent is extended or adjusted under 35 U.S.C. 154(b) by 17 days.

(21) Appl. No.: 13/098,240

(22) Filed: Apr. 29, 2011

(65) Prior Publication Data

US 2012/0273807 A1 Nov. 1, 2012

(51) Int. Cl.
*H01L 33/50* (2010.01)
*C23C 14/40* (2006.01)

(52) U.S. Cl.
USPC ........... 438/29; 257/88; 257/98; 257/E33.061

(58) Field of Classification Search
None
See application file for complete search history.

(56) References Cited

U.S. PATENT DOCUMENTS

| 6,630,691 | B1 * | 10/2003 | Mueller-Mach et al. ....... 257/84 |
| 6,650,044 | B1 * | 11/2003 | Lowery .......................... 313/502 |
| 6,667,574 | B2 * | 12/2003 | Aoki et al. .................... 313/582 |
| 6,696,703 | B2 * | 2/2004 | Mueller-Mach et al. ....... 257/98 |
| 7,285,791 | B2 | 10/2007 | Beeson et al. |
| 7,514,721 | B2 * | 4/2009 | Krames et al. ................. 257/98 |
| 7,795,600 | B2 * | 9/2010 | Beeson et al. ............ 250/483.1 |
| 7,902,564 | B2 * | 3/2011 | Mueller-Mach et al. ....... 257/98 |
| 2003/0020084 | A1 | 1/2003 | Fan et al. |
| 2004/0145895 | A1 * | 7/2004 | Ouderkirk et al. ............ 362/260 |
| 2005/0051790 | A1 | 3/2005 | Ueda |
| 2005/0077531 | A1 | 4/2005 | Kim |
| 2005/0269582 | A1 * | 12/2005 | Mueller et al. .................. 257/94 |
| 2007/0001178 | A1 * | 1/2007 | Tran et al. ....................... 257/79 |

(Continued)

FOREIGN PATENT DOCUMENTS

| DE | 10 2008 011 848 | 9/2009 |
| DE | 10 2008 062 933 | 7/2010 |
| DE | 10 2009 037 186 | 2/2011 |
| WO | WO 2009/106069 | 9/2009 |

OTHER PUBLICATIONS

Zheng, Yi, and Matthew Stough. White LED With High Package Extraction Efficiency. Rep. No. DE-FC26-06NT42935. Beverly MA: Osram Sylvania Nov. 2008.*

(Continued)

*Primary Examiner* — Thomas L Dickey
*Assistant Examiner* — Joseph Schoenholtz
(74) *Attorney, Agent, or Firm* — Cozen O'Connor

(57) ABSTRACT

A light-emitting semiconductor chip is provided, the semiconductor chip comprising a semiconductor body having a pixel region with at least two electrically isolated sub-regions, each sub-region comprising an active layer, which generates electromagnetic radiation of a first wavelength range during operation, a separately manufactured ceramic conversion die over a radiation emission area of at least one sub-region, said conversion die being configured to convert radiation of the first wavelength range into electromagnetic radiation of a second wavelength range, wherein a width of the conversion die does not exceed 100 μm. Further, a method for the production of a light-emitting semiconductor chip and method for the production of a conversion die are provided.

11 Claims, 4 Drawing Sheets

U.S. PATENT DOCUMENTS

| | | | |
|---|---|---|---|
| 2007/0126017 A1* | 6/2007 | Krames et al. | 257/98 |
| 2007/0159067 A1 | 7/2007 | Yun et al. | |
| 2007/0221867 A1 | 9/2007 | Beeson et al. | |
| 2009/0140272 A1* | 6/2009 | Beeson et al. | 257/89 |
| 2009/0155943 A1* | 6/2009 | Krames et al. | 438/29 |
| 2009/0309114 A1* | 12/2009 | Lu et al. | 257/98 |
| 2010/0020531 A1 | 1/2010 | Choi et al. | |
| 2010/0119839 A1 | 5/2010 | Chen | |
| 2010/0127293 A1* | 5/2010 | Sommer et al. | 257/98 |
| 2010/0200886 A1* | 8/2010 | Krames et al. | 257/98 |
| 2010/0308361 A1* | 12/2010 | Beeson et al. | 257/98 |
| 2011/0018011 A1* | 1/2011 | Beeson et al. | 257/89 |
| 2012/0086026 A1* | 4/2012 | Engl et al. | 257/93 |

OTHER PUBLICATIONS

H. Bechtel, P. Schmidt, W. Busselt and B. S. Schreinemacher "Lumiramic: A new phosphor technology for high performance solid state light sources", SPIE Proc. 8th Int. Conf. Solid State Lighting-Proc., pp. 70580E-1-70580E-10 (2008).*

Fan, Xuejun. "Wafer Level System Packaging and Integration for Solid State Lighting." IEEE 13th International Conference on Thermal, Mechanical and Multi-Physics Simulation and Experiments in Microelectronics and Microsystems, 2012.*

Christian Sommer, Paul Hartmann, Peter Pachler, Marko Schweighart, Stefan Tasch, Günther Leising, Franz P. Wenzl, A detailed study on the requirements for angular homogeneity of phosphor converted high power white LED light sources, Optical Materials, vol. 31, Issue 6, Apr. 2009, pp. 837-848.*

H. Bechtel, "Phosphor Converted LEDs with Saturated Emission," in Solid-State and Organic Lighting, OSA Technical Digest (CD) (Optical Society of America, 2010), paper SOTuB1.*

Mueller-Mach, Regina, Gerd Mueller, Michael R. Krames, Henning A. Höppe, Florian Stadler, Wolfgang Schnick, Thomas Juestel, and Peter Schmidt. "Highly Efficient All-nitride Phosphor-converted White Light Emitting Diode." Physica Status Solidi (a) 202.9 (2005): 1727-732.*

Patel, B. et.al., Liftoff Process Using Positive Photoresist, Mar. 6, 2003.*

Choe J.Y. "Luminescence and compositional analysis of Y3Al5O12:Ce films fabricated by pulsed-laser deposition" Material Research Innovations (2002), pp. 238-241.

Kottaisamy M. et al. "Color tuning of Y3Al5O12:Ce phosphor and their blend for white LED's" Materials Research Bulletin 43 (2008), pp. 1657-1663.

May-Smith T.C. et al. "Comparative growth study of garnet crystal films fabricated by pulsed laser deposition" Journal of Crystal Growth 308 (2007), pp. 382-391.

* cited by examiner

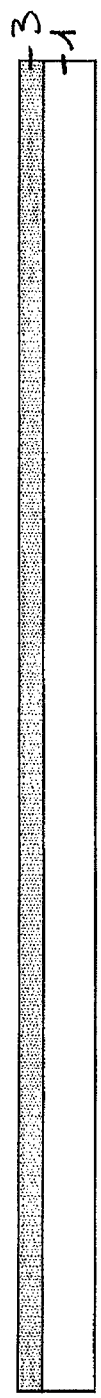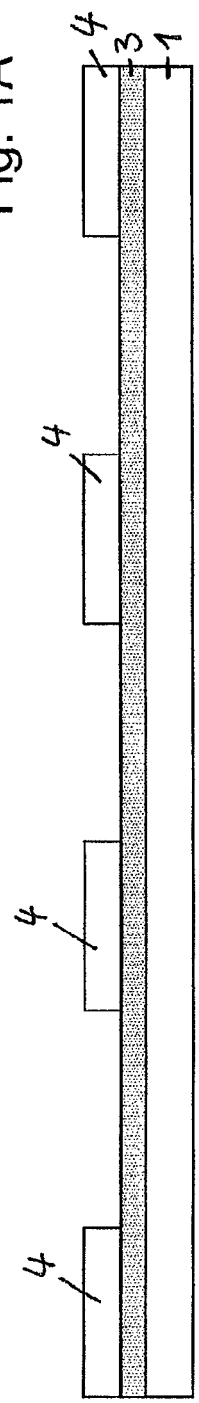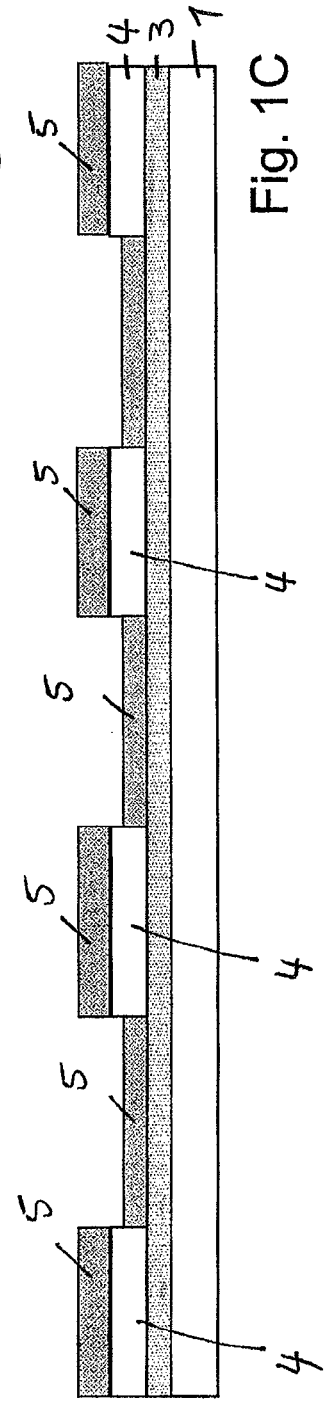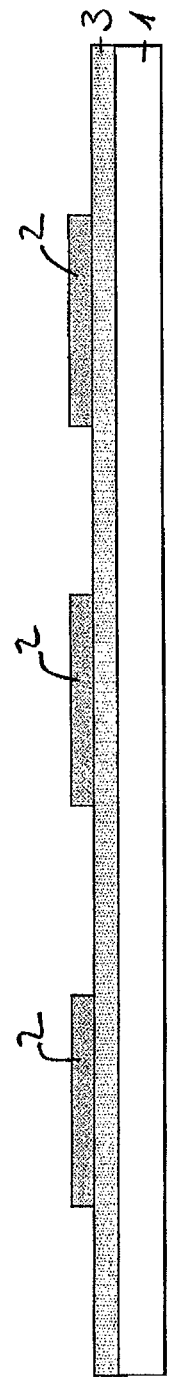

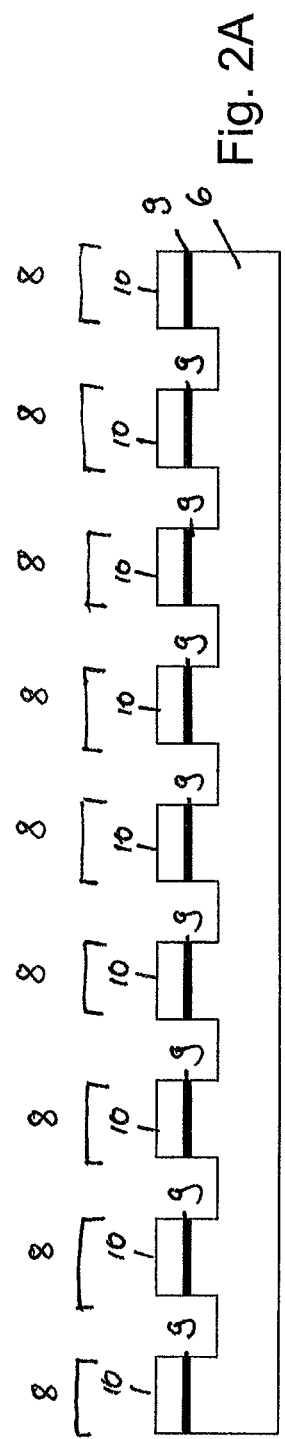
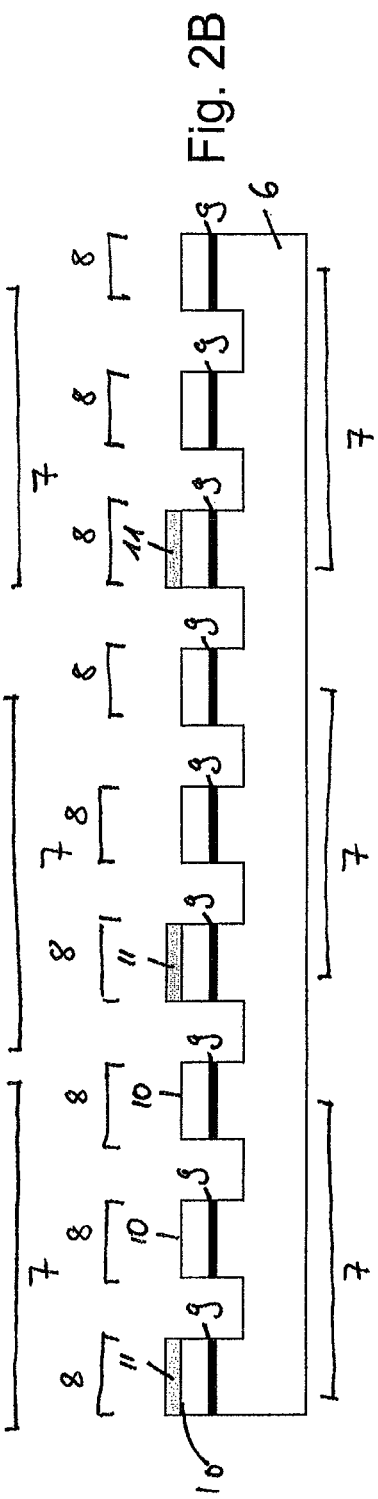
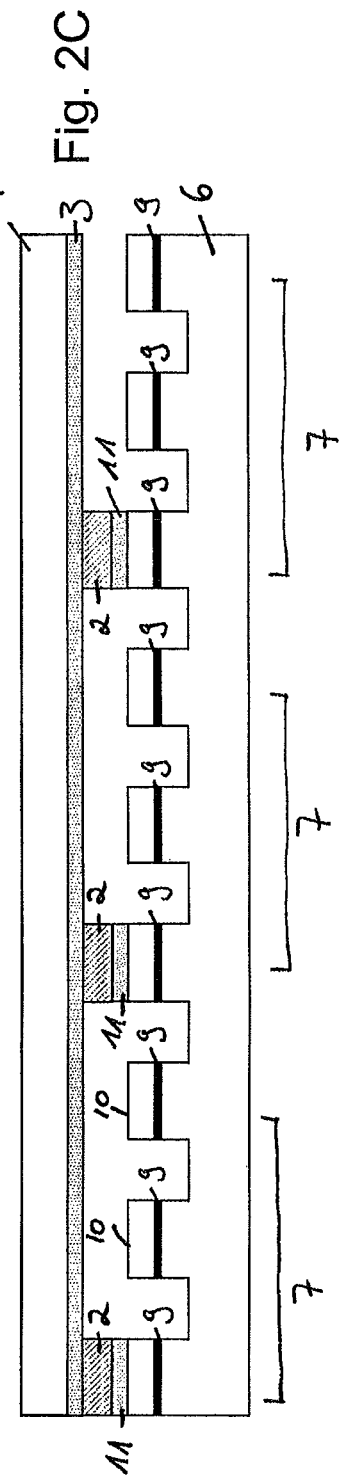

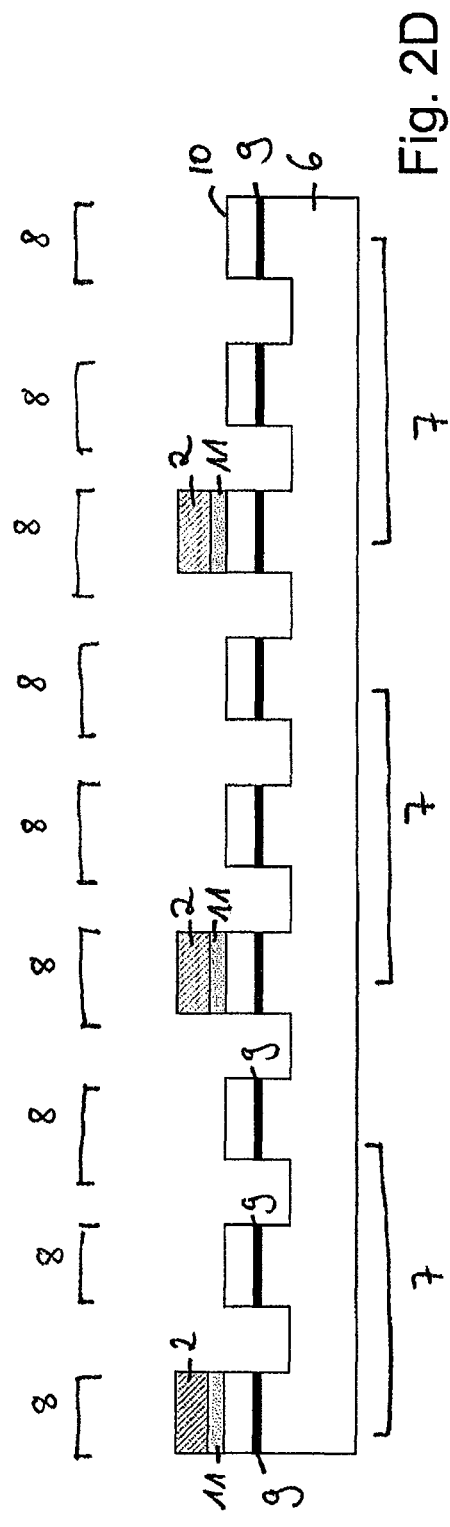
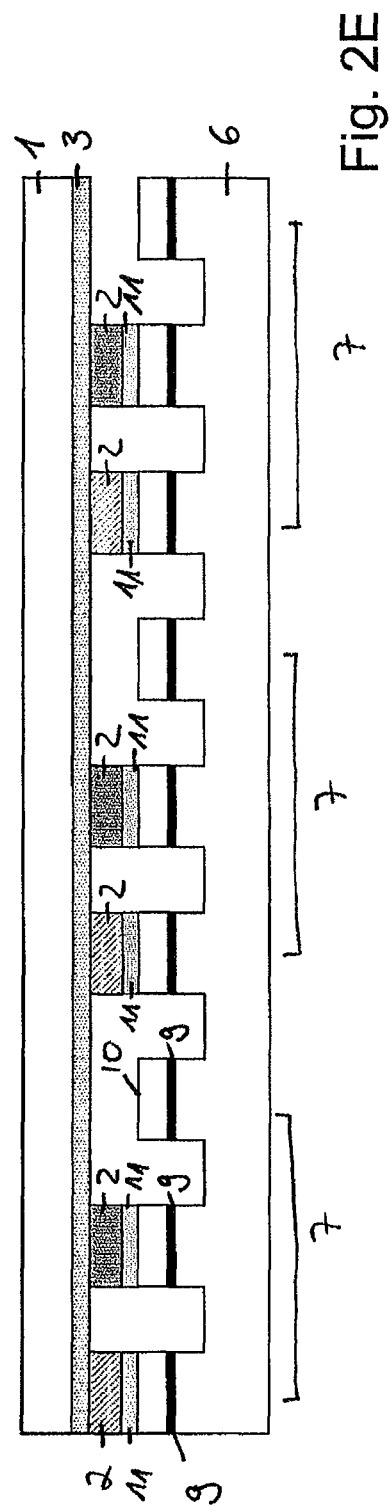

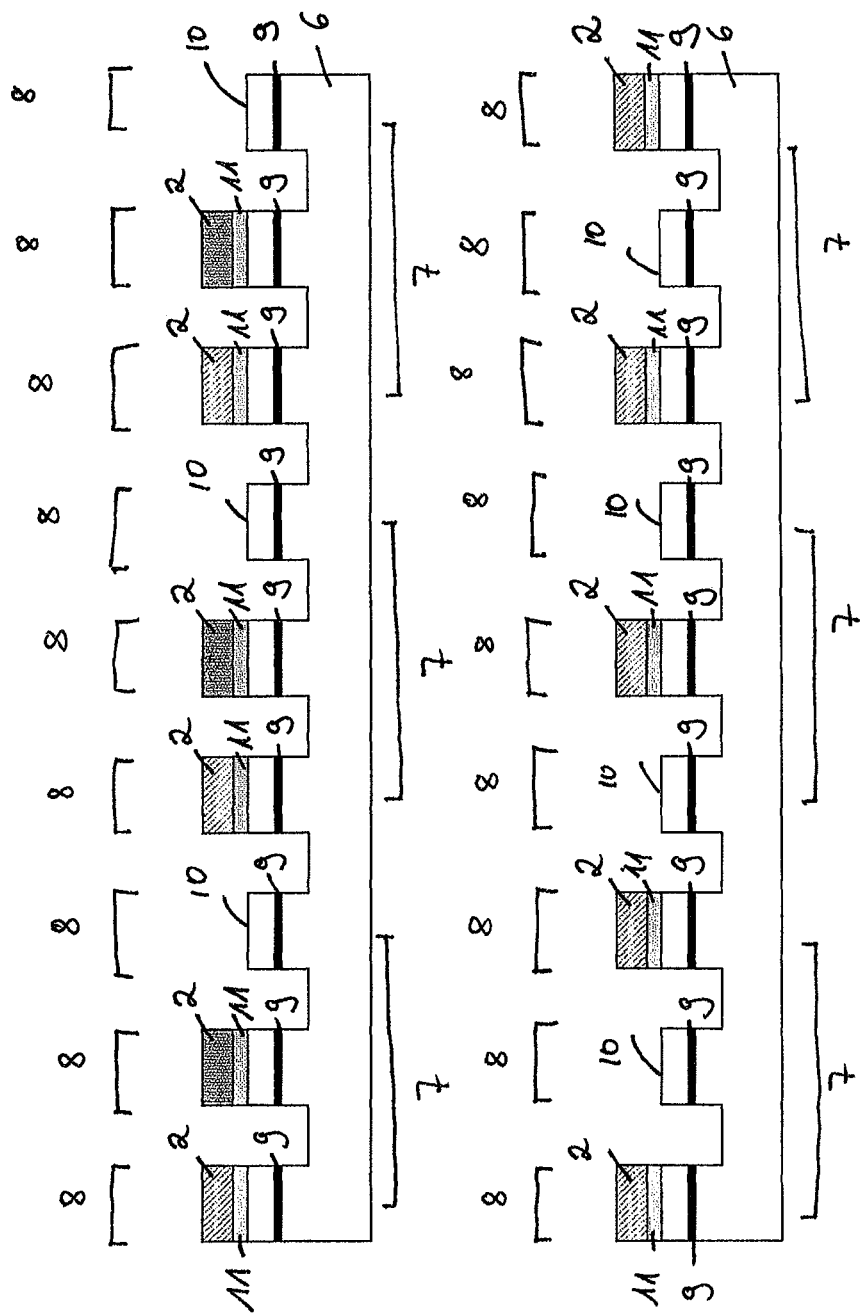

METHOD FOR THE PRODUCING OF A LIGHT-EMITTING SEMICONDUCTOR CHIP, METHOD FOR THE PRODUCTION OF A CONVERSION DIE AND LIGHT-EMITTING SEMICONDUCTOR CHIP

BACKGROUND OF THE INVENTION

Field of the Invention

Light-emitting semiconductor chips are, for example, described in the following references: DE 10 2009 037 186, US 2010/0020531 A1, US 2007/0159067 A1, US 2010/0119839 A1, U.S. Pat. No. 6,696,703 B2 and U.S. Pat. No. 7,285,791 B2.

SUMMARY OF THE INVENTION

One objective of the present invention is to provide a light-emitting semiconductor chip for the use in a display, wherein the efficiency of the display is improved.

A further objective of the invention is to provide a method for the production of a conversion die having particularly small dimensions.

Furthermore, a simplified method for the production of a light-emitting semiconductor chip with a conversion die having particularly small dimensions should be provided.

A light-emitting semiconductor chip comprises in particular:
- a semiconductor body having a pixel region with at least two electrically isolated sub-regions, each sub-region comprising an active layer, which is configured to generate electromagnetic radiation of a first wavelength range during operation, and
- a separately manufactured ceramic conversion die over a radiation emission area of at least one sub-region, said conversion die being configured to convert radiation of the first wavelength range in electromagnetic radiation of a second wavelength range, wherein a width of the conversion die does not exceed 100 μm.

The semiconductor chip is particularly configured for the use in a display. Further, the semiconductor chip can be used as a light source for a projection unit.

The conversion die has the objective to convert radiation of the active region into light of a different color. In such a way a semiconductor chip with pixel regions emitting white light can be achieved.

In particular, the conversion die has a width which does not exceed 100 μm. The width of the conversion die preferably does not exceed a width of the sub-region. Preferably, the width of the conversion die is equal to the width of the sub-region. It is particularly preferable that an area of a main face of the conversion die is equal to the light emission area of the sub-region. A semiconductor chip with small sub-regions of a pixel-region allows the construction of a display having improved efficiency.

According to an embodiment of the light-emitting semiconductor chip, the conversion die is arranged in direct contact with the radiation emission area of the sub-region. It is particularly preferable that the conversion die is arranged such that it does not protrude over the light emission area of the sub-region.

According to a further embodiment of the semiconductor chip, the pixel region comprises a first sub-region and a second sub-region, wherein each sub-region emits light of the blue spectral range from its light emission area. Further, a first conversion die is arranged over the light emission area of the first sub-region, said first conversion die converts the electromagnetic radiation of the first wavelength range in electromagnetic radiation of the yellow spectral range. According to this embodiment, the light emission area of the second sub-region is preferably free of a conversion die.

Preferably, the semiconductor chip therefore comprises sub-regions emitting blue light and sub-regions emitting yellow light, wherein the yellow light is generated by the conversion of blue light from the active region into yellow light by the conversion die, which is arranged over the sub-region. The light-emitting semiconductor chip preferably emits light with a white color.

Since the sub-regions are electrically isolated from each other, the color of the light emitted by the light-emitting semiconductor chip can be varied by adapting the current driving the different sub-regions according to this embodiment.

According to a further embodiment of the light-emitting semiconductor chip, the pixel region comprises a first sub-region, a second sub-region and a third sub-region, each sub-region emitting light of the blue spectral range from its light emission area. A first conversion die is arranged over the light emission area of the first sub-region. Said first conversion die converts the electromagnetic radiation of the first, blue wavelength range into electromagnetic radiation of the red spectral range. A second conversion die is arranged over the light emission area of the second sub-region, which converts the electromagnetic radiation of the first, blue wavelength range into electromagnetic radiation of the green spectral range. According to this embodiment, the third sub-region is preferably free of a conversion die.

Preferably, the conversion die is configured for full-conversion. That means that the part of the radiation converted by the conversion die is maximized.

The thickness of the conversion die is one parameter that determines the amount of the converted radiation. According to one embodiment the thickness of the conversion die is therefore mapped to the desired color locus.

It is particularly preferable that the width of the conversion die does not exceed 50 μm. The width of the conversion die lies preferably between 0.5 μm and 20 μm and particularly preferably between 2 μm and 5 μm.

A conversion die, which is configured to convert electromagnetic radiation of the first wavelength range into electromagnetic radiation of a second wavelength range, can be produced, for example, by the following method:
- providing a substrate,
- applying a structured photoresist layer on the substrate,
- depositing a conversion layer of a conversion material over the photoresist layer by one of the following methods: Pulsed-Laser-Deposition, sputtering, e-beam deposition, ion beam assisted pulsed laser deposition, aerosol deposition and
- removing the photoresist layer, such that discrete conversion dies are formed on the substrate.

Preferably, the substrate is only heated minimally during the application of the conversion material, since otherwise the photoresist layer might be damaged.

Preferably, the conversion die comprises a ceramic phosphor material or is formed by a ceramic conversion material. For example a garnet doped with rare earths can be used as material for the conversion die. Further, the conversion die can comprise one of the following materials or can be formed by one of the following materials: Cerium-doped garnets, such as $Lu_3Al_5O_{12}:Ce^{3+}$, $Tb_3Al_5O_{12}:Ce^{3+}$; nitrides, such as $M_2Si_5N_8:Eu^{2+}$, wherein M=Ca, Sr, Ba; oxynitrides, such as $MSi_2O_2N_2:Eu^{2+}$, wherein M=Ca, Sr, Ba; Silicates, such as BaMgSi$_4$O$_{10}$:Eu$^{2+}$, M$_2$SiO$_4$:Eu$^{2+}$, wherein M=Ca, Ba, Sr. The conversion die can also comprise one of the following materials or can be formed by one of the following materials: MAlSiN$_3$:Eu, MS:Eu, wherein M is a metal selected from Ca, Sr, Ba; A$_2$O$_3$:Eu, Bi, wherein A is selected from Sc, Y, La, Gd, Lu; other tertiary and higher metal oxides doped with divalent or trivalent Europium, including functional groups like molybdates, niobates or tungstates.

The thickness of the conversion dies lies preferably between 10 μm and 15 μm, including the limits.

With the help of the structured photoresist layer it is possible to achieve ceramic conversion dies having small dimensions.

According to one embodiment the conversion dies are recrystallized by one of the following methods: microwave annealing, laser annealing, Rapid-Thermal-Annealing (RTA-Annealing), annealing in a tube furnace.

In general, radiative annealing methods—for example by the help of microwave radiation or laser light—conductive annealing methods, wherein the material is in contact with another hot surface or convective annealing methods, for example heating through gas or liquid phase contact, can be used. Preferably, the annealing method rises the temperature of the conversion die rapidly and not necessarily in a full extend of the object. For example, the substrate is much cooler than the conversion die during the annealing process.

According to a further embodiment, the substrate comprises a sacrificial layer and the substrate and the conversion dies are separated from each other by removing the sacrificial layer.

According to a further embodiment, the sacrificial layer comprises a nitride based material. For example, the sacrificial layer comprises one of the following materials or is formed of one of the following materials: silicon nitride, gallium nitride, aluminum nitride, titanium nitride, aluminum gallium nitride, strontium nitride, boron nitride, wolfram nitride, tantalum nitride, zirconium nitride, hafnium nitride. Furthermore, the sacrificial layer can comprise zinc oxide or can be formed of zinc oxide. Such a sacrificial layer and in particular a nitride based sacrificial layer can, for example, be removed by the help of UV-radiation or by chemical etching.

According to on embodiment, the sacrificial layer has a thickness between 10 nm and 1000 nm, including the limits. Preferably, the sacrificial layer has a thickness between 50 nm and 1000 nm, including the limits. Particular preferably, the sacrificial layer has a thickness between 250 nm and 500 nm, including the limits.

The substrate, for example, comprises one of the following materials or is formed by one of the following materials: sapphire, quartz glass, garnets or other oxides.

According to a preferred embodiment of the method the photoresist layer is at least as thick as the conversion layer. Preferably, the photoresist layer is as twice as thick as the conversion layer. Such a thick photoresist layer enables removing the photoresist layer in a manner that discrete conversion dies are formed on the substrate.

The thickness of the photoresist layer lies preferably between 20 μm and 30 μm, including the limits.

A method for the production of a light-emitting semiconductor chip comprises in particular the following steps:
providing a substrate,
applying a structured photoresist layer on the substrate,
depositing a conversion layer of a conversion material over the photoresist layer by one of the following methods: Pulsed-Laser-Deposition, sputtering, e-beam deposition, ion beam assisted pulsed laser deposition, aerosol deposition,
removing the photoresist layer, such that a plurality of discrete conversion dies is formed on substrate,
providing a wafer with a plurality of pixel regions, each pixel region having at least two electrically isolated sub-regions, each sub-region comprising an active layer, which generates electromagnetic radiation of a first wavelength range during operation,
connecting at least one sub-region of each pixel region with one conversion die, and
removing the substrate.

With the help of this method it is possible to produce light-emitting semiconductor chips with conversion dies on wafer level in an easy way. In particular, this method provides the conversion dies on the substrate, which simplifies their arrangement adjusted to the sub-regions. This simplifies the production of the semiconductor chips in particular if conversion dies having small dimensions are used.

The substrate can, for example, be removed with the help of a sacrificial layer as already described above.

According to a further embodiment the conversion dies and the sub-regions are connected to each other by direct bonding or by the help of an adhesive layer. The adhesive layer can comprise or can be formed of one of the following materials: silicone, low melting point glass, hybrid materials of organic adhesives and inorganic glass.

For direct bonding, the surface of the conversion die, which is intended to be connected to the light emission area of the sub-region as well as the sub-region itself, is preferably coated with a layer formed by silicon oxide.

It goes without saying that features which are described in connection with the method for the production of the conversion die or the semiconductor chip can be adapted to the method for production of the semiconductor chip and vice versa.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Further preferred embodiments and developments of the invention are described in the following in connection with the Figures.

FIGS. 1A to 1D schematically show different method steps for the production of a conversion die according to one embodiment.

FIGS. 2A to 2F schematically show sectional views of a semiconductor chip at different method steps according to one embodiment.

FIG. 3 shows a schematic sectional view of a semiconductor chip according to a further embodiment.

DETAILED DESCRIPTION OF THE PRESENTLY PREFERRED EMBODIMENTS

Equal or similar elements as well as elements of equal function are designated with the same reference signs in the figures. The figures and the proportions of the elements shown in the figures are not regarded as being shown to scale.

Rather, single elements, in particular layers, can be shown exaggerated in magnitude for the sake of better presentation.

According to the embodiment of FIGS. 1A to 1D a substrate 1 is provided for the production of a plurality of conversion dies 2. The substrate 1 can, for example, be formed of sapphire. On one main face of the substrate 1 a sacrificial layer 3 is arranged. The sacrificial layer 3 can, for example, comprise one of the following materials: silicon nitride, galliumnitride, aluminum nitride, titanium nitride, aluminum gallium nitride, strontium nitride, boron nitride, wolfram nitride, tantalum nitride, zirconium nitride, hafnium nitride, zinc oxide (FIG. 1A).

A structured photoresist layer 4 is applied on the sacrificial layer (FIG. 1B). The regions of the substrate which are free of the photoresist layer 4 are intended to form the later conversion die 2. The width of the regions on the substrate 1, which are free of photoresist, preferably does not exceed 100 µm and particularly preferably does not extend over 50 µm. For example the width of the regions which are free of photoresist lies between 0.5 µm and 20 µm and preferably between 2 µm and 5 µm.

In the present embodiment, the photoresist layer 4 is at least as thick as the later conversion die 2.

In a next step, a conversion layer 5 of a conversion material is deposited over the photoresist layer 4 (FIG. 1C). The deposition of the conversion material is preferably achieved by one of the following methods: Pulsed-Laser-Deposition, sputtering, e-beam deposition, ion beam assisted pulsed laser deposition, aerosol deposition. The photoresist layer 4 is preferably at least as thick as the conversion layer 5.

In a further step the photoresist layer 4 is removed such that discrete conversion dies 2 are formed on the substrate 1 (FIG. 1D). According to the present embodiment, the conversion dies 2 are formed of a ceramic material.

It is particularly preferable that the conversion dies 2 are tempered in a next step in order to achieve a recrystallization of the conversion material. A recrystallization can be achieved, for example by one of the following methods: microwave annealing, laser annealing, RTA-annealing.

The material for the conversion die 2 can be chosen from one of the following materials: Cerium-doped garnets, such as $Lu_3Al_5O_{12}:Ce^{3+}$, $Tb_3Al_5O_{12}:Ce^{3+}$; nitrides, such as $M_2Si_5N_8:Eu^{2+}$, wherein M=Ca, Sr, Ba; Oxynitrides, such as $MSi_2O_2N_2:Eu^{2+}$, wherein M=Ca, Sr, Ba; Silicates, such as $BaMgSi_4O_{10}:Eu^{2+}$, $M_2SiO_4:Eu^{2+}$, wherein M=Ca, Ba, Sr. The conversion die can also comprise one of the following materials or can be formed by one of the following materials: MAlSiN3:Eu, MS:Eu, wherein M is a metal selected from Ca, Sr, Ba; A2O3:Eu, Bi, wherein A is selected from Sc, Y, La, Gd, Lu; other tertiary and higher metal oxides doped with divalent or trivalent Europium, including functional groups like molybdates, niobates or tungstates.

Pulsed-Laser-Deposition of a YAG-phosphor is, for example, described in one of the following references: Jae Young Choe, "Luminescence and compositional analysis of $Y_3Al_5O_{12}:Ce$ films fabricated by pulsed-laser deposition", Mat. Res. Innovat. (2002) 6:238-241, T. C. May-Smith, "Comparative growth study of garnet crystal films fabricated by pulsed laser deposition", Journal of Crystal Growth 308 (2007) 382-391, M. Kottaisamy et al. "Color tuning of $Y_3Al_5O_{12}:Ce$ phosphor and their blend for white LEDs", Materials Research Bulletin 34 (2008) 1657-1663. The content of these references is incorporated herein by reference in its entirety.

YAG:Ce for example can convert light of the blue spectral range into light of the yellow spectral range. Phosphors, which can convert light of the blue spectral range into light of the red spectral range are for example: $M_2Si_5N_8:Eu$, $MAlSiN_3:Eu$, MS:Eu, wherein M is a metal selected from Ca, Sr, Ba; $A_2O_3:Eu$, Bi, wherein A is selected from Sc, Y, La, Gd, Lu.

Materials for converting light of the blue spectral range into light of the green spectral range are for example: Lu-garnets, oxynitrides, $M_2SiO_4:Eu$ and other silicates.

In the following an embodiment of a method for the production of a semiconductor chip is described in connection with FIGS. 2A to 2F.

A structured semiconductor body 6 is provided (FIG. 2A). The semiconductor body 6 comprises a plurality of pixel regions 7, each pixel region 7 having three electrically isolated sub-regions 8. Each sub-region 8 comprises an active layer 9, which generates light of the blue spectral range during operation. The active layer 9 preferably comprises a pn-transition, a double hetero structure, a single quantum structure or a multi quantum structure for the generation of radiation. Here, the term "quantum structure" means quantum wells, quantum wires as wells as quantum dots.

The blue light generated in the active layer 9 is emitted from a light emission area 10 of the sub-region 8. Semiconductor bodies with electrically isolated sub-regions are, for example, described in reference DE 10 2008 011 848 A1, whose content is incorporated herein by reference in its entirety.

In a next step the light emission areas 10 of each first sub-region 8 are covered with an adhesive layer 11 (FIG. 2B). The adhesive layer 11 can comprise or can be formed of one of the following materials: silicone, low melting point glass, hybrid materials of organic adhesives and inorganic glass.

Then, a substrate 1 with a plurality of conversion dies 2 is arranged over the light emission areas 10 with the adhesive layers 11. The plurality of conversion dies 2 can, for example, be produced as described above in connection with FIGS. 1A to 1D.

The conversion dies 2 are adjusted to the first sub-regions 8 and connected to their light emission areas 10 (FIG. 2C). The substrate 1 is removed by removing the sacrificial layer 3 between substrate 1 and conversion dies 2 (FIG. 2D). The sacrificial layer 3 can, for example, comprise a nitride based material, which can be removed by radiation with ultraviolet light.

The conversion die 2, which is arranged on the light emission area 10 of each first sub-region 8 converts the light of the blue spectral range generated by the active layer 9 into light of the red spectral range. Preferably, the conversion die 2 is configured to convert a major part of the blue light emitted from the light emission area 10 of the sub-region 8 into red light.

In a next step a plurality of conversion dies 2 is provided on a substrate 1 again (FIG. 2E). The conversion dies 2 are configured to convert the light of the blue spectral range generated by the active layer 9 into light of the green spectral range.

The conversion dies 2 are arranged, adjusted and connected to the light emission areas 10 of the second sub-regions 8 in the same way as already described in connection with FIGS. 2B to 2D.

FIG. 2F shows a schematic sectional view of the finished semiconductor chip. The semiconductor chip comprises a semiconductor body 6 with a plurality of pixel regions 7. Each pixel region 7 comprises three sub-regions 8. The sub-regions 8 are electrically isolated from each other. Each sub-region 8 comprises an active layer 9 configured to generate blue light, which is emitted from a light emission area 10 of the sub-region 8.

The light emission area 10 of each first sub-region 8 is covered with a conversion die 2, which is configured to convert the major part of the blue light of the active layer 9 into red light.

The light emission area 10 of each second sub-region 8 is covered with a conversion die 2, which is configured to convert a major part of the blue light generated by the active layer 9 into light of the green spectral range.

Each third sub-region 8 of the pixel regions 7 is free of a conversion die 2, such that the light emission area 10 of each third sub-region 8 emits light of the blue spectral range during operation.

In the present embodiment each pixel region 7 represents a VGA-pixel for the use in a display having full color resolution.

In contrast to the semiconductor chip according to FIG. 2F, the semiconductor chip according to the embodiment of FIG. 3 has a semiconductor body 6 with pixel regions 7 having two electrically isolated sub-regions 8 instead of three sub-regions 8. Each sub-region 8 has an active layer 9 configured to generate blue light, which is emitted from the light emission area 10 of each sub-region 8.

Each first sub-region 8 is provided with a conversion die 2, which converts the blue light of the active layer 9 into yellow light. Each second sub-region 8 of each pixel region 7 is free of a conversion die 2, such that the sub-region 8 emits blue light during operation. The semiconductor chip according to FIG. 3 generates white light during operation.

The invention is not limited to the description of the embodiments. Rather, the invention comprises each new feature as well as each combination of features, particularly each combination of features of the claims, even if the feature or the combination of features itself is not explicitly given in the claims or embodiments.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for the production of a conversion die, which is configured to convert electromagnetic radiation of a first wavelength range into electromagnetic radiation of a second wavelength, said method comprising the steps of:

providing a substrate;
applying a structured photoresist layer on the substrate;
depositing a conversion layer of a conversion material over the photoresist layer by one of the following methods: Pulsed-Laser-Deposition, sputtering, e-beam deposition, ion beam assisted pulsed laser deposition, aerosol deposition; and
removing the photoresist layer, such that discrete conversion dies are formed on the substrate;
wherein the substrate comprises a sacrificial layer comprising one of a nitride based material and an oxide based material, the substrate and the conversion dies being separated from each other by removing the sacrificial layer.

2. The method of claim 1, wherein the conversion dies are recrystallized by one of the following methods: microwave annealing, laser annealing, RTA-annealing, annealing in a tube furnace.

3. The method of claim 1, wherein the substrate comprises sapphire, quartz glass, garnets or other oxides.

4. The method of claim 1, wherein the photoresist layer is at least as thick as the conversion layer.

5. The method of claim 1, wherein a width of the conversion die does not exceed 100 µm.

6. A method for the production of a light-emitting semiconductor chip comprising the steps of:

providing a substrate;
applying a structured photoresist layer on the substrate,
depositing a conversion layer of a conversion material over the photoresist layer by one of the following methods: Pulsed-Laser-Deposition, sputtering, e-beam deposition, ion beam assisted pulsed laser deposition, aerosol deposition;
removing the photoresist layer, such that a plurality of discrete conversion dies are formed on the substrate;
providing a wafer with a plurality of pixel regions, each pixel region having at least two electrically isolated sub-regions, each sub-region comprising an active layer, which is configured to generate electromagnetic radiation of a first wavelength range during operation;
connecting at least one light emission area of one sub-region of each pixel region with one conversion die, and removing the substrate.

7. The method of claim 6, wherein the substrate comprises a sacrificial layer and the substrate is removed by removing the sacrificial layer.

8. The method of claim 7, wherein the sacrificial layer comprises a nitride based material.

9. The method of claim 6, wherein the conversion dies and the light emission areas of the sub-regions are connected by direct bonding or by the help of an adhesive layer.

10. The method of claim 1, wherein a width of the conversion die does not exceed 50 µm.

11. The method of claim 1, wherein a width of the conversion die lies between 2 µm and 20 µm.

* * * * *